United States Patent [19]

Tamamizu et al.

[11] Patent Number: 4,710,428

[45] Date of Patent: Dec. 1, 1987

[54] SINTERED SILICON CARBIDE POROUS BODY IMPREGNATED WITH METALLIC SILICON

[75] Inventors: Teruyasu Tamamizu, Sagamihara; Kichihei Sato; Takashi Tanaka, both of Oguni; Shunkichi Sato, Sekikawa, all of Japan

[73] Assignee: Toshiba Ceramics Co., Ltd., Tokyo, Japan

[21] Appl. No.: 837,821

[22] Filed: Mar. 10, 1986

[51] Int. Cl.$^4$ ............................................. B32B 9/00
[52] U.S. Cl. .................................. 428/408; 118/725; 428/698
[58] Field of Search ................ 428/408, 698; 118/725

[56] References Cited

U.S. PATENT DOCUMENTS 4,503,807 3/1985 Nakayama et al. ............... 118/725
4,536,449 8/1985 Kennedy et al. ................... 428/698

Primary Examiner—William J. Van Balen
Attorney, Agent, or Firm—Schwartz, Jeffery, Schwaab, Mack, Blumenthal & Evans

[57] ABSTRACT

A susceptor for use in an in-line or continuous deposition of a film on a silicon wafer by a CVD process, which comprises Si-SiC ceramic containing 7% to 25% by weight of metallic silicon having a high purity. The susceptor has enhanced mechanical strength and dimensional stability and can normally be used repeatedly a large number of times. Further, by using such a susceptor a uniform film can be deposited on the silicon wafer by the CVD process, and a silicon wafer can be coated with a film having desired electrical properties by the CVD process without contaminating the silicon wafer.

10 Claims, 2 Drawing Figures

SINTERED SILICON CARBIDE POROUS BODY IMPREGNATED WITH METALLIC SILICON

BACKGROUND OF THE INVENTION

This invention concerns a susceptor for supporting a silicon wafer and, more specifically, it relates to a susceptor for supporting a silicon wafer during in-line coating or deposition on the silicon wafer by a chemical vapor deposition (CVD) process.

Generally, in the case of applying an in-line CVD coating on a silicon wafer, the silicon wafer is mounted in a supporting recess of a susceptor attached to a conveyor of a coating apparatus, and a layer of a material such as silicon is deposited on the surface of the wafer, for example, by heating the wafer in a reactor or a reaction chamber of the coating apparatus and supplying vapor including silicon to the reactor or the reaction chamber.

The susceptor used conventionally for forming the coating film by the in-line or continuous CVD process has a laminated structure, for example, comprising a substrate made of a heat resistant metal alloy of nickel and chromium (Inconel TM, from International Nickel Co., Inc.) and a coating layer such as $CR_2O_3$ coated on the surface of the substrate.

Since a susceptor of this kind is composed of a material having a high coefficient of thermal expansion and heating of the susceptor results in a heat distortion, there is a danger that a coating film produced by the CVD process may not have a uniform thickness. The thickness of the film deposited by the CVD process may be subject to an error up to about 8%.

For example, in a dual layer structure consisting of a $Cr_2O_3$ layer on an Inconel substrate, since the heat conductivity of the $Cr_2O_3$ layer is much smaller than that of the Inconel substrate, heat conduction through the $Cr_2O_3$ layer is not sufficient. Accordingly, when a susceptor having such a dual layer structure is heated from below, there is a danger that the temperature at the surface of the silicon wafer may vary slightly depending on the positions on the surface thereof and elapse of time.

In addition, it is difficult to control the thickness of the $Cr_2O_3$ layer, particularly, to control the thickness of the layer so as to be uniform for each of the susceptors. Accordingly, there is a danger that the temperature at the surface of the wafer may vary on every susceptor. Therefore, there is a possibility that an error or a difference in the thickness of the film produced by the CVD process on the silicon wafer may occur depending on location on a wafer, or on the positions of an individual wafer or wafers on each susceptor.

Further, such a dual structure may possibly cause the $Cr_2O_3$ layer to delaminate due to the difference in the coefficients of thermal expansion between the Inconel substrate and the $Cr_2O_3$ layer, as well as heat distortion may be caused in the susceptor, the amount of distortion increasing as the size of the susceptor is enlarged. Accordingly, heat contact with a wafer mounted in the recess of the susceptor becomes incomplete. Thus, the temperature at the surface of the wafer and the orientation of the wafer may vary on every wafer and result in variations in the manner of contact between the gas stream and the wafer or in the heat dissipation from the surface of the wafer by the gas stream on every wafer. This causes an error or a difference in the thickness and in the uniformity of the thickness of the film formed on the surface of the wafer by the CVD process.

A susceptor used for the in-line CVD process is generally produced by using an Inconel plate, for example, of about 1 mm to 2 mm thickness as a substrate and forming a supporting recess of a size required for supportingly receiving the lower portion of a silicon wafer on the surface of the susceptor, for example, by pressing. As described above, a dimensional change or difference results due to the heat distortion of the recess for supporting the silicon wafer, and the change becomes greater as the size of the susceptor is increased. Accordingly, it is not always easy to produce a susceptor having a supporting recess with a large diameter for use in coating a silicon wafer by the CVD process, particularly, a recess having a diameter of greater than five inches.

Further, it is desired that a susceptor for use in inline coating of a silicon wafer by the CVD process have enhanced heat resistance and spalling resistance, as well as has a high mechanical strength. Furthermore, it is preferred that the material of the susceptor does not generate gases. Accordingly, an intrusion of undesired impurities, however small, into the in-line or continuous coating apparatus should preferably be avoided. Cleanliness and control of the impurities are extremely important in order for a semiconductor element prepared from the wafer to have the desired basic electrical properties.

SUMMARY OF THE INVENTION

The object of this invention is to provide a susceptor for use in an in-line or continuous CVD coating process, which is capable of applying a uniform film by the CVD process.

It is another object of this invention to provide a susceptor which has a high heat resistance, a high spalling resistance, good dimensional stability and a high mechanical strength.

It is another object of this invention to provide a susceptor which is extremely impermeable to gases and is capable of producing a silicon wafer having desired electrical properties without contaminating the wafer.

According to this invention, a susceptor for use in in-line deposition on a silicon wafer by a CVD process is comprised of a Si-SiC ceramic containing from about 7% to 25% by weight of metallic silicon of high purity.

DETAILED DESCRIPTION OF THE PREFERRED EMBODIMENT

Figure 1:
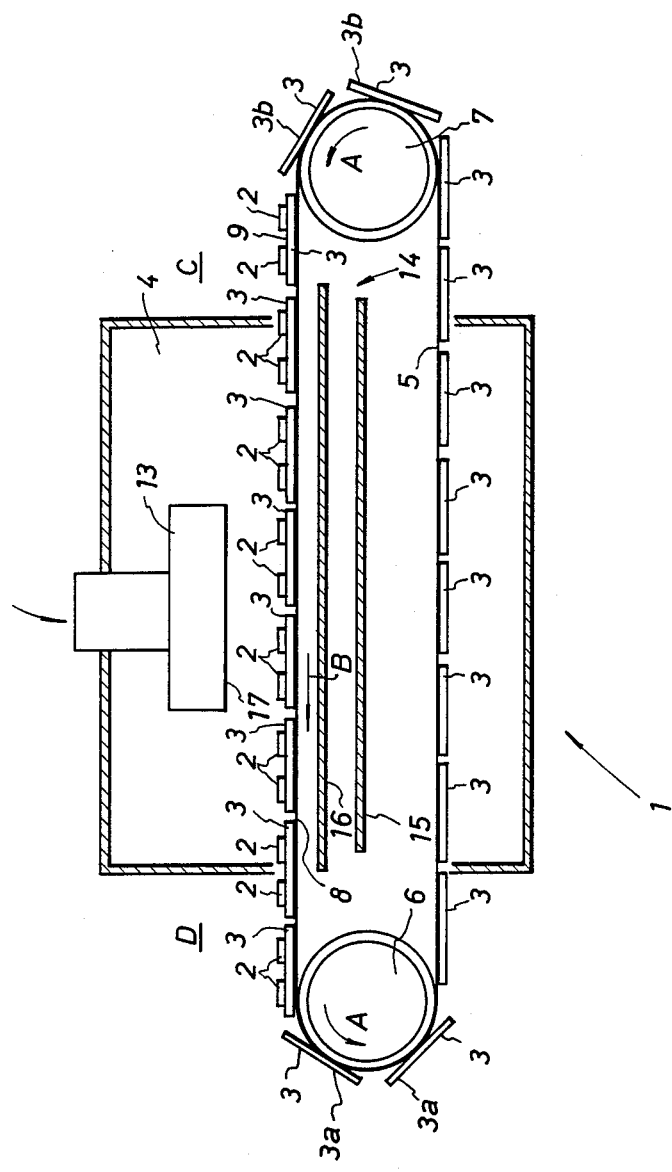
FIG. 1 is a schematic cross-sectional view illustrating an in-line or continuous CVD apparatus using a susceptor according to this invention.

In this specification, "Si-SiC" or "Si-SiC ceramic" means a material comprising a mixture of silicon carbide (SiC) and metallic silicon (Si). Furthermore, the term "in-line" or "continuous" for the CVD apparatus in this specification means such a type, other than a batchwise system, in which the CVD process is continuously carried out in a reactor while wafers are continuously introduced and withdrawn.

According to this invention, the Si-SiC ceramic constituting the susceptor is, preferably, formed by impregnating the pores of a sintered body comprising SiC with molten metal silicon at a high temperature.

Sintered bodies having adequate mechanical strength may be obtained with SiC particles having a particle size from about 1 micron to about 300 microns. Preferably the size of the SiC particles constituting the sintered body is from about 10 microns to about 150 microns. The pore size of the sintered body may range up to about 1 mm and still maintain adequate mechanical strength, but the pore size is preferably about 50 microns.

In the susceptor of this invention, the metallic Si content is about 7% to 25% by weight. If the amount of the metallic Si is less than 7% by weight, decomposition products of an organic binder which is used for preparing the sintered SiC body, that is, carbon remaining in the sintered body as free carbon, or unfilled pores remaining in the sintered body may possibly exert an undesired effect on the silicon wafer upon in-line coating of the silicon wafer by the CVD process. Specifically, there is a possibility that free carbon remaining in the sintered body might diffuse into the silicon wafer and thereby contaminate the wafer. Further, there is a possibility that contaminating material might be absorbed into unfilled pores remaining in the sintered body, and that the absorbed material might diffuse during the CVD coating thereby to contaminate a silicon wafer. On the other hand, if the amount of the metallic silicon exceeds 25% by weight, the mechanical strength of the Si-SiC ceramic is small, and this may bring about problems in the mechanical handling of the susceptor when the material is used to make a susceptor for in-line CVD coating.

According to this invention, the purity of the metallic silicon used for forming the Si-SiC ceramic is preferably not less than 99% by weight. The purity is, more preferably, not less than 99.9% by weight. Also, the purity of the sintered body of SiC used for forming the Si-SiC ceramic is preferably not less than 99% by weight, more preferably, not less than 99.9% by weight.

Generally, the susceptor of this invention is of appropriate size that it can be used for ordinary in-line CVD coating. Also, the susceptor has at least one supporting recess formed on its surface for mounting a wafer. The supporting recess on the susceptor can be formed by usual means, for example, grinding or pressing. The size of the supporting recess depends on the size of the silicon wafer to be mounted thereon. Particularly, since the susceptor of the invention is made of Si-SiC ceramic, it is free from physical defects which have resulted so far from use of conventional laminated structures. In addition, the susceptor can maintain the supporting recess at an extremely high dimensional accuracy during the CVD coating, particularly, in the case of a susceptor having a large supporting recess in which a silicon wafer five inches or greater in diameter is mounted.

Further, the susceptor of this invention is formed by impregnating a SiC sintered body with a predetermined amount of metallic silicon having a high purity so that the susceptor is impermeable to gases. Thus, there is no danger that the susceptor material may generate such gases which would introduce impurities to the atmosphere or hinder the provision of desired electrical properties to the silicon wafer.

Referring now to the drawings, the invention will be explained in conjunction with a process for forming a CVD film on a silicon wafer by an in-line or continuous CVD coating apparatus using a susceptor according to the invention.

In FIG. 1, a susceptor 3 of this invention is fixedly or detachably mounted on a conveyor 5 that passes through a reactor 4 of a CVD apparatus 1. A belt conveyor 5 is disposed around a pair of rotationally driven rollers 6 and 7, and driven to circulate so that the upper running portion 8 of the conveyor 5 is moved in the direction of an arrow B in accordance with the rotation of the driven rollers 6 and/or 7 in the direction of arrows A.

Figure 2:
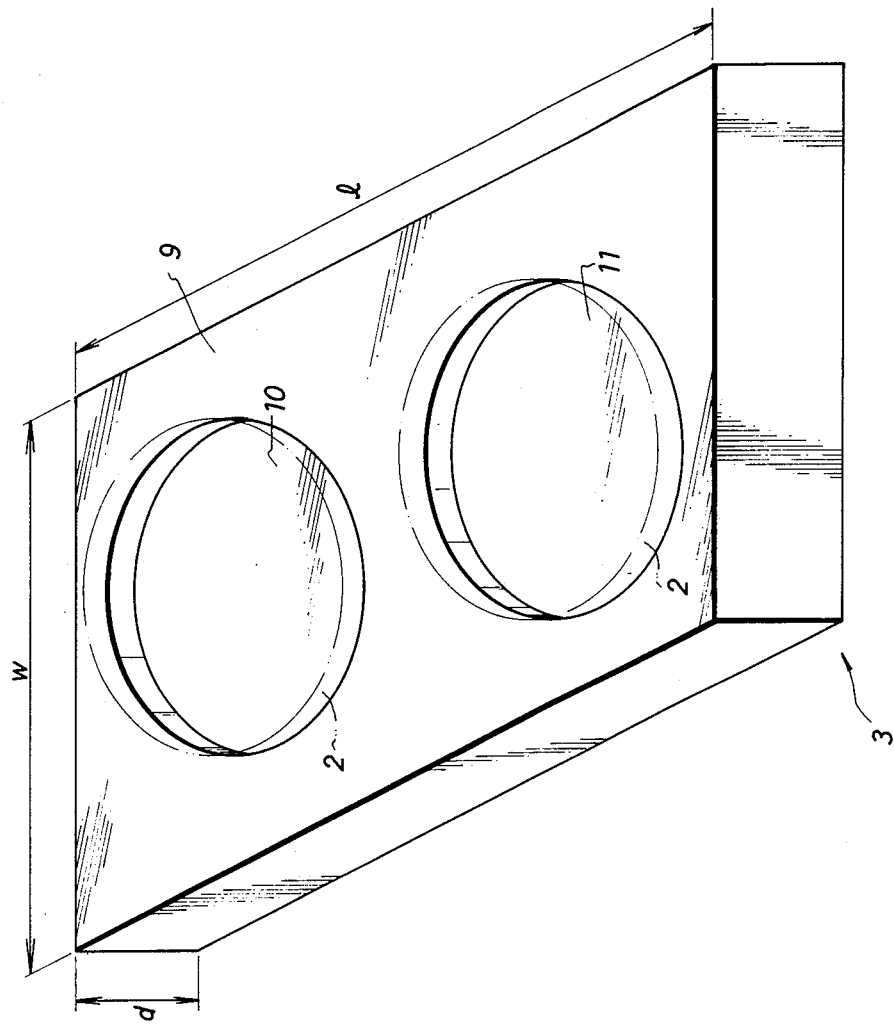
FIG. 2 is a perspective view of a susceptor used in the CVD apparatus shown in FIG. 1.

Each of the susceptors 3 attached to the outside of the belt conveyor 5 has a plate shape, for example, of 175 mm width, 400 mm length and 5 mm thickness, and has supporting recesses 10 and 11 having diameters of five inches, and depths of 0.3 mm, respectively, on the outer side 9 thereof as shown in FIG. 2. Recesses 10 and 11 are formed by grinding.

Before the susceptor 3 is introduced into the reactor 4 of the CVD apparatus 1, silicon wafers 2 of substantially the same diameter (5 inches) and of about 0.6 mm to 0.7 mm thickness are mounted in the recesses automatically or manually. Since the susceptor comprises Si-SiC ceramic, it has substantially the same coefficient of thermal expansion as the silicon wafer. Accordingly, the diameter of the recesses 10 and 11 of the susceptor 3 can be set substantially the same as the diameter of the silicon wafers 2, so that the silicon wafers 2 can just be fit into the recesses 10 and 11.

The silicon wafers 2 are mounted in the recesses 10 and 11 of the susceptor 3 at the mounting station C and are introduced into the reactor 4 by the circulation of the conveyor 5 in the direction of the arrow B which accompanies the rotation of the rollers 6 or 7 in the direction of the arrow A. Gases such as $SiH_4$ and $O_2$ are introduced from an introducing mechanism 13 into the reactor 4, circulatd by a proper gas circulation mechanism (not illustrated) and exhausted by a suitable exhaust mechanism (not illustrated). Thus, the silicon wafers 2 in the reactor 4 can be coated by the CVD process, for example, with $SiO_2$.

In the susceptor 3 of this invention, since the pores of the SiC sintered body are impregnated with 7% to 25% by weight of metallic silicon having a high purity, no actual diffusion of impurities from the pores occurs, and the atmospheric gas in the reactor 4 is scarcely contaminated. Further, the mechanical strength of the susceptor 4 is relatively high. Accordingly, when a force is applied to the susceptor 3, for example, at the position shown at 3a, 3b or the like around the roller 6 or 7 in FIG. 1, there is no danger that the susceptor 3 may be distorted or damaged.

A heater 14 is disposed for heating the silicon wafer 2 to a predetermined temperature from the inside of the conveyor 5. Heater 14 comprises a heat source 15 and a heat diffusing plate 16 which serves as a heat releasing source providing a uniform temperature over a broad range. The heat source 15 may be of the induction heating type, the resistance heating type or the infrared radiation heating type. The diffusing plate 16 may be made of, for example, a quartz glass.

In the CVD apparatus 1, since the susceptor 3 comprises substantially uniform Si-SiC ceramic, that is to say the Si and SiC are each substantially uniformly distributed throughout the body of the susceptor, there is less possibiity of causing distortion or the like to the susceptor 3, and the susceptor 3 can ensure that proper heat conditions will exist to heat the silicon wafer 2 in the recess 10 or 11 of the susceptor 3 to a predetermined uniform temperature. Further, the susceptor 3 has approximately the same level of heat conductivity as that of the silicon wafer 2. Accordingly, the silicon wafer 2 can entirely be heated uniformly from the side of the susceptor 3. Furthermore, the characteristics of each of the susceptors 3 can be approximately identical with those of all other susceptors, and the temperature of each of the silicon wafers 2 can be maintained substantially the same.

Accordingly, in the CVD apparatus 1, the surface of the silicon wafer 2 mounted and supported in the supporting recess 10 or 11 of the susceptor 3 can surely be set and maintained at a predetermined temperature, by which a film having a predetermined composition deposited by the CVD process can be uniformly and reliably formed to have a predetermined thickness.

The silicon wafer 2 with the CVD film deposited thereon in the reactor 4 exits from the reactor together with the susceptor 3. Thereafter, the silicon wafer 2 is taken out of the susceptor 3 at the discharge or exhaust station D.

In the CVD apparatus 1, an infrared irradiation heating source or the like may optionally be disposed at position 17 of the introducing mechanism 13, so that the heating may also be carried out from above.

In the case of forming a silicon dioxide film on the silicon wafer 2, the temperature of the silicon wafer 2 may be set to about 400° C. The identity and nature of the reaction gas and the temperature of the silicon wafer can optionally be varied depending on the kind of the film to be deposited.

This invention will be more clearly understood with reference to the following examples which are illustrative only and should not be considered to limit the scope of the invention:

EXAMPLES

A plate of Si-SiC ceramic 175 mm in width, 400 mm in length and 5 mm in thickness containing 12% by weight of metallic silicon was used, and supporting recesses having 5 inches in diameter were formed on one surface thereof by machining to produce a susceptor having recesses 10 or 11 for use in the in-line or continuous CVD coating as shown in FIG. 2 (Example 1).

In the same manner, susceptors for in-line CVD coating having supporting recesses each of which is 4 inches (Example 2) and 6 inches (Example 3) in diameter were prepared.

In the same manner, the susceptors of a Comparative Example 1 were prepared, which were comprised of Inconel and a Cr$_2$O$_3$ coating layer as described above.

Using the susceptors of Examples 1, 2 and 3 according to this invention and the susceptors of Comparative Example 1 prepared as described above, in-line CVD coating of the silicon wafers was carried out using a CVD apparatus as shown in FIG. 1. As a result, in all of the susceptors of Comparative Example 1, the coating layer was partially delaminated after being used 10 times and the susceptors could scarcely be used. On the other hand, in all of the susceptors of Examples 1, 2 and 3, no changes in the material were observed at all even after being used 100 times.

Further, with regard to dimensional changes in the supporting recesses, while there occurred significant changes in the supporting recesses larger than five inches in diameter in the susceptors of Comparative Example 1 after 10 times of use, no dimensional changes were recognized in all of the susceptors according to this invention, even the susceptors of Example 3 which had 6-inch diameter recesses.

When a CVD film is formed on a silicon wafer using the susceptor of Comparative Example 1, after the dimensional change of the recess, no CVD film of uniform thickness could be formed. This is because the contact between the wafer and the susceptor becomes incomplete so that the temperatures at the surface of the silicon wafer vary on every wafer, or the orientation of the wafer varies from wafer to wafer, thereby resulting in a difference in the manner of contact between a gas stream and the wafer.

Furthermore, the differences in the thickness of the CVD film among the wafers were as large as from 6% to 9% in the case of Comparative Example 1. On the other hand, the differences in thickness were as low as from 2% to 4% and better CVD film with less scattering could be formed in the susceptor formed of Si-SiC ceramic according to this invention.

Then, for comparison, a Si-SiC susceptor containing 35% by weight of metallic silicon (Comparative Example 2) and a Si-SiC susceptor containing 3% by weight of metallic silicon (Comparative Example 3) were produced in the same size as that of the susceptor in Example 1, and in-line or continuous CVD coating of a silicon wafer was carried out in the same manner as described above. As a result, no changes in the material and the shape were recognized at all in the susceptor of the examples according to this invention even after being used for about 100 times. On the other hand, in the susceptor of Comparative Example 2, cracking took place at an end portion of the susceptor due to the large content of the metallic silicon and the lower mechanical strength, and it was no longer usable after being used for twenty or thirty times. Further, in the susceptor of Comparative Example 3, since the proportion of metallic silicon was low, residual free carbon in the material reacted with the silicon wafer during the CVD process and undesirably affected the electrical properties of the silicon wafer when used as a chip.

As specifically described above, the susceptor of this invention has enhanced mechanical strength and dimensional stability, can be used for many times, enables the coating or deposition of a uniform film on a silicon wafer by the CVD process and is extremely impermeable to gas, thereby making it possible to reliably and economically produce a silicon wafer having desired electical properties without contaminating the wafer.

What is claimed is:

1. A susceptor for use in an in-line deposition of a coating on a silicon wafer by a CVD process, comprising Si-SiC ceramic comprising a sintered body of SiC with pores therein impregnated with from about 7% to 25% by weight of metallic silicon of high purity.

2. A susceptor according to claim 1, wherein the purity of the metallic silicon is at least 99% by weight.

3. A susceptor according to claim 1, wherein the purity of the metallic silicon is at least 99.9% by weight.

4. A susceptor according to claim 1, wherein the Si-SiC ceramic is formed from a sintered body of SiC having a purity of at least 99% by weight.

5. A susceptor according to claim 1, wherein the pore size in the sintered body of SiC is about 50 microns.

6. A susceptor according to claim 1, wherein the pore size in the sintered body of SiC is about 1 mm.

7. A susceptor according to claim 1, which is impermeable to gas.

8. A susceptor according to claim 1, having at least one recess for receivingly mounting therein a silicon wafer having a diameter of at least 4 inches.

9. A susceptor according to claim 1, having at least one recess for receivingly mounting therein a silicon wafer having a diameter of at least 5 inches.

10. A susceptor according to claim 1, having at least one recess for receivingly mounting therein a silicon wafer having a diameter of at least 6 inches.

* * * * *